Figure 1:
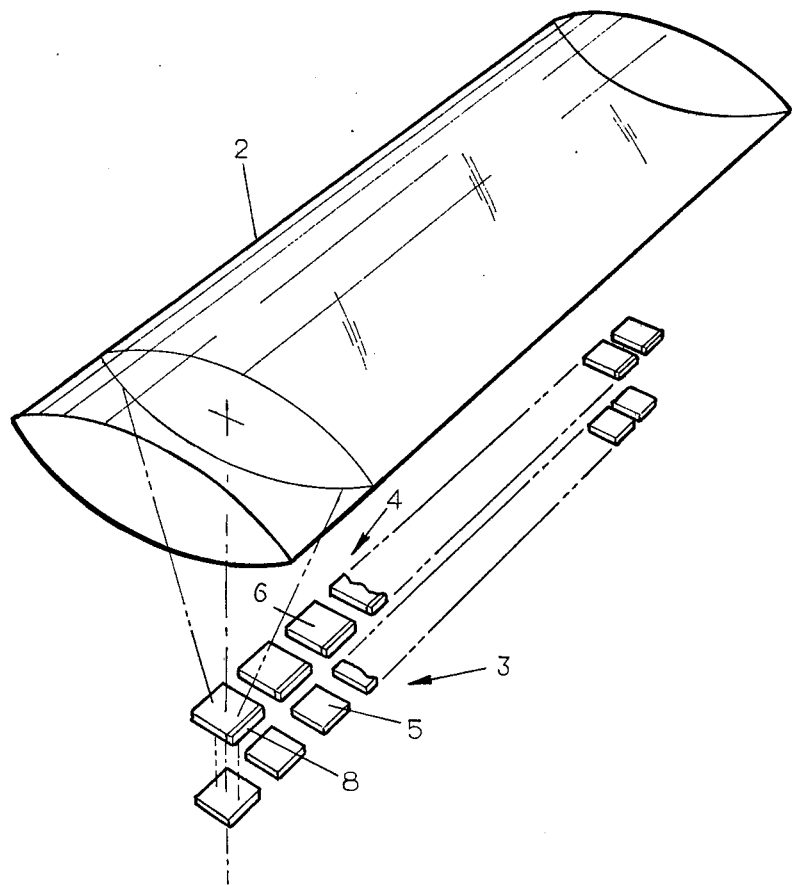

United States Patent [19]

Boling

[11] 4,268,709
[45] * May 19, 1981

[54] GENERATION OF ELECTRICAL ENERGY FROM SUNLIGHT, AND APPARATUS

[75] Inventor: Norman L. Boling, Toledo, Ohio

[73] Assignee: Owens-Illinois, Inc., Toledo, Ohio

[ * ] Notice: The portion of the term of this patent subsequent to Feb. 12, 1997, has been disclaimed.

[21] Appl. No.: 105,452

[22] Filed: Dec. 20, 1979

Related U.S. Application Data

[63] Continuation of Ser. No. 921,419, Jul. 3, 1978, Pat. No. 4,188,238.

[51] Int. Cl.³ .............................................. H01L 31/00
[52] U.S. Cl. ..................................................... 136/247
[58] Field of Search ..................................... 136/89 FC

[56] References Cited

U.S. PATENT DOCUMENTS 4,188,238  2/1980  Boling ............................. 136/89 FC Primary Examiner—Aaron Weisstuch
Attorney, Agent, or Firm—Charles S. Lynch; Myron E. Click; David H. Wilson

[57] ABSTRACT

Disclosed is concentrating sunlight optically and impinging the concentrated light on at least one luminescent solar collector coupled to a first photocell, passing residual concentrated sunlight to at least one other luminescent solar collector in one embodiment, coupled to a different photocell and finally passing the remaining concentrated sunlight directly to a still different photocell.

2 Claims, 5 Drawing Figures

GENERATION OF ELECTRICAL ENERGY FROM SUNLIGHT, AND APPARATUS

This is a continuation of application Ser. No. 921,419 filed July 3, 1978 U.S. Pat. No. 4,188,238.

This invention concerns the art of exposing semiconductors to sunlight to convert at least a part thereof to electrical energy. Such means for converting electromagnetic energy to electricity are known as photovoltaic cells or photocells, and common examples of such photocells are silicon or gallium arsenide semiconductors having P-N junctions. Commonly, an electrical lead is connected on either side of the semiconductor across the P-N junction.

Semiconductor photocells are very expensive; in consequence, it has been the practice to gather and concentrate the sunlight reaching a given semiconductor photocell so that such extremely large areas of semiconductor material need not be employed as would be necessary without such a gathering system. The common gathering systems in the past were optical systems, wherein lens systems concentrated the light and focused same on a given photocell.

However, such a lens system, utilized to impinge sunlight directly on solar cells, was and is relatively expensive. More recently, however, there has been conceived a different type of collector of radiation to be impinged on a semiconductor photocell. For instance, Weber and Lambe in Applied Optics, Vol. 15, pages 2299-2300, October 1976, disclose a system whereby a large area sheet of material, such as a rigid plastic or a glass doped with a luminescent material is exposed to solar radiation. The luminescent medium ideally has a strong absorption for the sun's rays, especially in the visible where the solar spectrum peaks, and it emits electromagnetic radiation of a longer wavelength suitable for activating the semiconductor photocell. A large portion of the light emitted from the luminescent species is in effect trapped in the collector with essentially total internal reflection until the light reaches the area where a photocell, such as a silicon photocell, is optically coupled to a small area, for instance an edge, of the collector. In this way the light from the sun is not only converted to more suitable wavelengths for activation of the photocell but is concentrated since the light received by the large area of the collector escapes only in the small area where the photocell is optically connected to the collector.

Another article, by Levitt and Weber, appearing in Applied Optics, Vol. 16, No. 10, pages 2684-2689, October 1977, should be read with the article first mentioned.

Other publications aiding in the understanding of the setting of the present invention include Goetzberger, Applied Physics, 14, 123-139, 1977, German patent application 2620115 published Nov. 10, 1977, and, referred to in the latter patent application, German patent application No. 2554226 published June 8, 1977, which is of some peripheral interest.

Also, numerous patents deal with the conversion of solar energy to different wavelengths by means of luminescent or fluorescent layers and impinging emitted light on a photocell; examples are U.S. Pat. Nos. 3,426,212, 3,484,606 and 3,912,931, which patents, however, do not have the concept of concentrating the light from a large area and collecting it over a much smaller area by optical coupling to a relatively small area semiconductor photocell. In U.S. Pat. No. 3,912,931 benzene and other aromatic hydrocarbons are said to be "fixed" in layers of a silicone resin superimposed on the photocell.

The present invention in a unique arrangement utilizes some of the principles of optical concentrators (lens or reflector) and luminescent solar collectors of the general type disclosed in the Goetzberger et al. publication, in German application No. 2620115, in the Weber and Lambe paper and in the Levitt and Weber paper. In this last publication, for instance, a square luminescent solar collector 68 mm. on a side and 2.8 mm. thick was given an aluminum mirror coating on three edges and coupled to a Si photovoltaic diode on the fourth edge.

As used herein and in the claims the term "luminescent solar collector" means a light conducting medium having two opposing, usually parallel, faces of extended area relative to the other surfaces of said medium (such as edges), which medium contains a luminescent species that absorbs solar radiation of one wavelength and emits at a longer wavelength. Of course, in accordance with well understood optical principles (Snells law), that portion of the emitted luminescent radiation generated at larger angles than the critical angle relative to a line perpendicular to a given extended surface of the medium is trapped within the medium by the process of total internal reflection. Such portion for a flat sheet having an index of refraction of 1.5 is about 75 percent, as is well-known. As is well-known a luminescent solar collector, because of total internal reflection, concentrates the trapped luminescent radiation and can deliver it to a relatively small area of the collector, such as one or more or all of the edges thereof where it can be optically coupled to a desired means, such as to a photovoltaic cell.

It is emphasized that the foregoing definition of a "luminescent solar collector" is broad, that the "light conducting medium" of said definition can be one layer or two or more layers of a light conducting material or materials such as a plastic or a glass, each layer being optically coupled to the next, to make the collector or trapping medium. One or more, or all, of the layers can contain a luminescent species as defined. When a luminescent species is present in more than one such layer the absorption band of one can advantageously overlap the emission band of the other species, thus coupling or cascading the emission of one luminescent species to the absorption of another. Or two or more such "coupled" luminescent species can be present in a given layer of the collection medium so that, again, the emission spectrum of one overlaps the absorption spectrum of the other in a cascade arrangement, as in Swartz et al. in Optics Letters Vol. 1, No. 2, August 1977, pp. 73-75, and in Science News, Vol. 112, No. 20, Nov. 12, 1977, pp. 313-314, or as on page 130 of the cited Goetzberger et al. publication.

The concept and structure of a luminescent solar collector having a light conducting medium of two or more layers is described in a paper entitled "Luminescent Solar Concentrator" by C. F. Rapp and N. L. Boling presented before the XIII IEEE Photovoltaic Specialists Conference, June 5-8 in Washington, D.C. at the Americana Hotel, and copies of this paper are currently available from the authors if addressed to them at P.O. Box 1035, Toledo, Ohio 43666. See also Optical Spectra April, 1978 under heading, "Industry Briefs."

In the method and the apparatus of the present invention the edge surfaces of the luminescent solar collectors not coupled to a photovoltaic cell have a highly reflective coating to prevent escape of trapped luminescent radiation at such edges, as will be understood.

It is an object of the present invention to improve the process of generating electrical energy by impinging electromagnetic radiation derived from sunlight on photovoltaic cells, both from the viewpoint of efficiency and of economics.

It is another object of the invention to provide a unique arrangement or combination of apparatus for such process.

Other objects, as well as aspects and advantages, of the invention will become apparent from a study of this specification.

According to a first important aspect of the present invention I provide a process (and an arrangement of apparatus) wherein the ease of concentrating sunlight optically is combined with the ability of luminescent solar collectors not only to concentrate but also to spectrally divide the optically concentrated radiation, which process comprises (1) concentrating solar radiation optically with lens or reflector means to provide optically concentrated radiation and (2) spectrally dividing said optically concentrated radiation by (i) absorbing a portion of said concentrated radiation and concentrating absorbed radiation in the form of longer wavelength emitted luminescent radiation by the process of total internal reflection in a first luminescent solar collector, (ii) passing the residual portion of said optically concentrated radiation through said first luminescent solar collector and, optionally, repeating steps (i) and (ii) using one or more subsequent luminescent solar collectors in series acting on the residual optically concentrated radiation passing through the preceding luminescent solar collector, (3) passing the concentrated emitted luminescent radiation in said first collector to a first photovoltaic cell optically coupled to a relatively small surface area of said first luminescent solar collector and passing the concentrated emitted luminescent radiation in each said subsequent luminescent solar collector, if any, to a different photovoltaic cell having a different bandgap than said first cell, which different cell is optically coupled to a relatively small surface area of the subsequent luminescent solar collector, and (4) impinging the residual optically concentrated radiation directly on a still different photovoltaic cell responsive to at least a portion of said residual radiation.

In the process and apparatus of the invention the optical means for concentrating sunlight (mirror or lens) is focused on a surface of extended area of a luminescent solar collector, a relatively small surface area of which (such as one or more edges thereof) is optically coupled to a semiconductor photovoltaic cell, and electrical connections are attached to said photovoltaic cell for recovering said electrical energy.

In the ordinary use of luminescent solar collectors, the maximum practical size of the collector is limited by the inherent absorption of light by the collector medium as well as by the fluorescent molecules (overlap of emission and absorption bands), as discussed in the cited Goetzberger et al. article. Thus, when a square luminescent solar collector is exposed to sunlight directly and one edge is coupled to a photocell or photocells, when the collector material itself is very low loss material, perhaps the length of a side can be 50 to 100 cm. or a little more.

When an optical concentrator of sunlight (lens or mirror) is used to impinge concentrated solar radiation on a photocell, almost any concentration factor can be achieved. However, the solar cell receives all wavelengths, but an appreciably large portion of the solar energy, especially of very short and very long wavelengths is converted to heat by many photocells, increasing the amount of cell cooling needed per watt when compared with luminescent solar collectors.

As noted, the method of producing electricity by optically concentrating sunlight and impinging it directly on solar cells is expensive. One reason is that existing practical semiconductor photocells are responsive only to a portion of the sun's rays to produce electricity with efficiency. Thus, with most photocells wavelengths in the ultraviolet and in some cases the low end of the infrared are only partly converted to electricity and much of the energy is converted to heat. As the wavelength absorbed approaches the bandgap wavelength the proportion of energy converted to heat is decreased, cell heating problems are decreased, and the efficiency of conversion of the radiation to electrical energy is increased. However, when sunlight is directly impinged on a photocell (whether or not after concentrating with a lens or mirror), all wavelengths are received and a great portion of the radiant energy is not utilized to generate electricity; moreover, a great portion of the lost energy is converted to heat that must be removed lest the cells become too hot. Thus, photons having much higher energy then the bandgap of a given photocell lose a great deal of the absorbed energy as heat, and absorbed photons having lower energy produce no electricity and are almost entirely converted to heat.

An advantage of the present apparatus and process is that the sunlight can be concentrated largely optically (lens or mirror), yet only the desired wavelengths (obtained by choice of the one or more luminescent species) need be delivered to the photocell, so that heating of the solar cell is minimized. Moreover, the luminescent solar collectors can be quite small since a very large proportion of the concentrating of the solar radiation has been done by the time that the solar radiation is delivered to the luminescent solar collector. Because of the small size of the matrix or host material the luminescent solar collector medium need not exhibit such extremely low absorption losses. On the other hand, such matrix material can be a high index of refraction material even though such materials be expensive, since it is used in relatively small amounts, and one can afford the best treatment thereof such as the best antireflection coatings and high quality mirroring of edges, all of which contribute to high trapping efficiencies.

Furthermore, relatively coarse tracking of the sun can be employed while still achieving high concentration of solar radiation, since one can focus on the medium-sized solar collector instead of focusing on the very small solar cell directly. Thus, when impinging the concentrated light on the collector, it is not important to illuminate the collector edge to edge so that it is possible to use a less sophisticated, less expensive tracking mechanism.

It is a distinct advantage that only relatively small (relative to the light collected) luminescent solar collectors need be used so that exotic (expensive) materials such as plastics or glasses can be used. This is particularly important with respect to choice of combination of dye and host material. Thus it is well-known that the host material can synergistically enhance or shift the properties of the luminescent material, such as a dye contained therein. For instance, the separation of the peaks of the absorption and emission spectra is influenced by the properties of the solvent, such as the static dielectric constant, for instance.

For the same reason, the small amounts necessary, very expensive luminescent species can also be employed.

Also, and often of prime importance, very expensive photocells can be economically employed because the combination of optical concentration of the broad solar spectrum, plus conversion of a part of the solar radiation to luminescent radiation by the luminescent solar collector, concentrating the emitted radiation by the process of total internal reflection and coupling such radiation to a photocell, allows the use of only a relatively very small amount of an expensive but efficient photocell material per watt of electricity generated.

Furthermore, practice of the present invention makes it more economical to effect spectral division of solar radiation by passing in series different portions of the solar spectrum to different luminescent solar collectors each of which is optically coupled to a photovoltaic cell having a different bandgap, similar to the spectral division disclosed in the cited Goetzberger et al. paper, particularly on pages 124-127 as discussed in connection with FIGS. 3, 6 and 7 therein. This is because the use of a single optical means (lens or mirror) for the first, large concentration of the radiant energy makes possible the use of much smaller luminescent solar collectors and much smaller photovoltaic cells in each step per watt output in each cell. Attention is invited to the proposal in IBM J. Res. Develop. Vol. 22, No. 2, March 1978, pages 112-120, by H. J. Hovel to first concentrate sunlight (1000 suns is mentioned) and then spectrally dividing the light into wave length ranges by means of optical filters and feeding each wavelength band to separate photocells. However, the optical filters are very expensive and difficult to fabricate.

It will be noted that all of the foregoing advantages, except that set forth in the last paragraph above, also apply to the detailed statement of the process (and corresponding arrangement of apparatus) of the invention, but considering only steps (1), (2) and (3), and in fact all of the advantages apply in such instance when the optional part of step (2) (ii) is practiced; and it is particularly noted that I have also conceived the processes (and corresponding arrangement of apparatus) disclosed in said steps (1) through (3), ignoring step (4).

It will be noted that in said step (4) the residual optically concentrated radiation (concentration by means of a lens or mirror) directly activates a photovoltaic or solar cell, so that this cell is normally of much greater area than the other photovoltaic cells. Thus, it is often advantageous that such photocell in step (4) be a silicon semiconductor photovoltaic cell since at present Si cells are by far the cheapest practical photocells, so that it is economical to omit attachment or coupling of such silicon photocell to a luminescent solar collector.

It will be seen from the foregoing, and from the following further description, that the novel process and unique arrangement of apparatus of the invention gives a combination of results and of advantages, synergistic in character.

Figure 2:
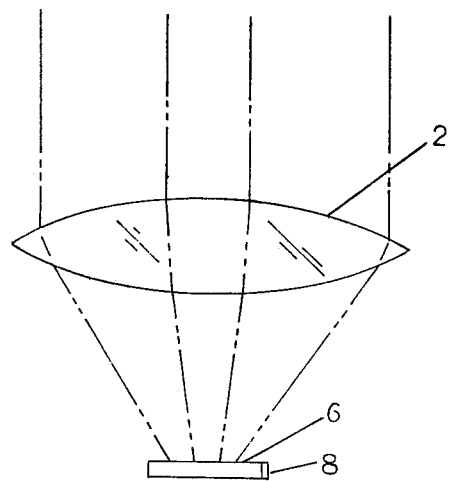
Figure 3:
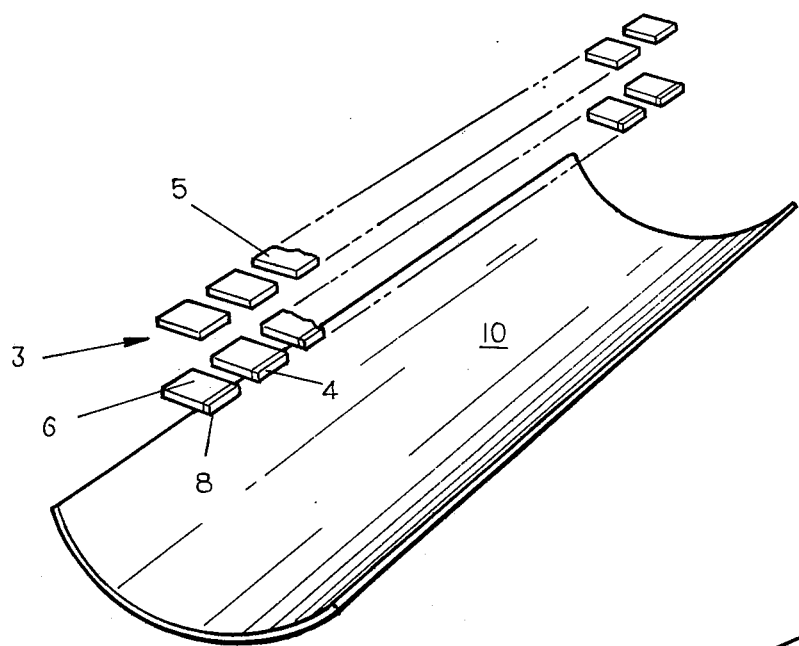
Figure 4:
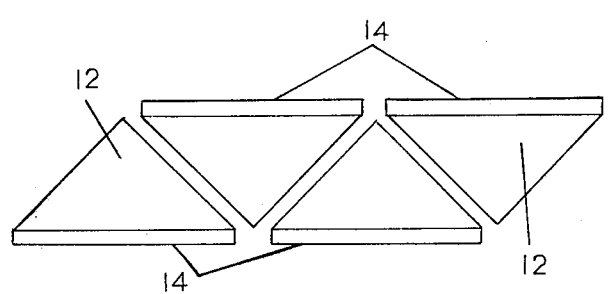
Figure 5:
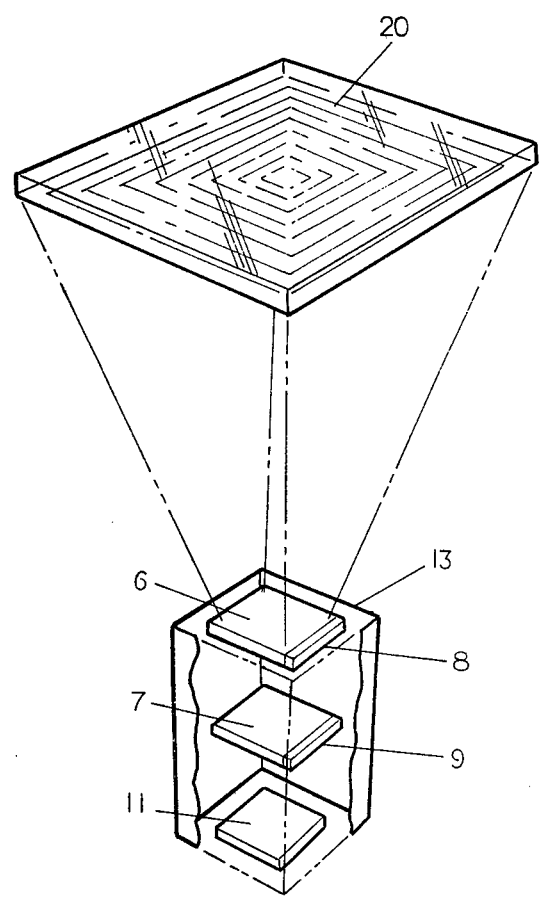

The nature of the invention will be described relative to some of its embodiments, in connection with the drawings, of which FIG. 1 is a perspective view of an elongated lens overlying a row of luminescent solar collectors and a row of photocells, FIG. 2 is an end view of FIG. 1, FIG. 3 is a perspective view of an elongated, trough-like mirror arranged under a row of luminescent solar collectors and a row of photocells, FIG. 4 is a top view of triangular luminescent solar collectors arranged in a row, and FIG. 5 is a perspective view of superimposed square luminescent solar collectors and a photocell arranged in series and associated with a square Fresnel lens.

In FIG. 1, elongated cylindrical lens 2 overlies a row 4 of square luminescent solar collector 6, each of which is optically coupled to semiconductor photovoltaic cell 8 having a P-N junction along one edge. Each solar collector 6 has its other edges coated with a highly reflective coating or is also coupled to a photovoltaic cell. Each cell 8 is connected to electrical conductors (not shown) on either side of the P-N junction to recover the generated electricity. The row 4 of collectors 6 is directly over row 3 of photovoltaic cells 5, different than photocells 8 and having a different bandgap. Each ideally has about the same area as collector 6 associated therewith.

The apparatus of FIG. 3 is the same as FIGS. 1 and 2 insofar as concerns the row 4 of luminescent solar collectors 6 containing photocells 8 optically coupled thereto. However, instead of using a lens a curved, trough-like mirror 10 is positioned beneath the row of photocells. Row 3 of photovoltaic cells 5 is the same as in FIGS. 1-2, except that it is positioned above row 4.

In FIG. 4 is shown a top view of a row of luminescent solar collectors 12, each of which is a flat triangular-shaped plate and each of which has on one side a semiconductor photocell 14 such as a gallium arsenide or a silicon photocell having a P-N junction, for instance. In each triangle the angle opposite the edge containing the photocell optically coupled to the luminescent solar collector has an angle of about 90° and the other two angles are each about 45°. Such a structure is optium for several reasons, as is set forth in the cited Goetzberger et al. article; see page 128. The other two edges of the photocell usually will have a highly reflective coating thereon, but it is possible that one or both of these edges also contain a photovoltaic cell. The row of triangular luminescent solar collectors with coupled photocells can be substituted for the row 4 of square photocells in the structure of FIGS 1-2 or the structure of FIG. 3.

The invention of course is not limited to any particular shape of lens or mirror or even of the luminescent solar collector. FIG. 5 illustrates this. In FIG. 5 the luminescent solar collector 6 with coupled photocell 8 can be the same as described with respect to one of the luminescent solar collectors of FIG. 1, but it can be in association with a single square lens 20 of the Fresnel type, which projects a substantially square pattern of light somewhat within the boundaries of the luminescent solar collector surface, so that it is not necessary to precisely track the sun. Beneath collector 6 is luminescent solar collector 7 having a photovoltaic cell 9 different than cell 8 and having a different bandgap, and beneath 7 is photovoltaic cell different than 8 or 9, having a different bandgap than either cell 8 or cell 9.

In all of the embodiments shown in the drawings, FIGS. 1, 2, 3, superimposed rows, and in FIG. 5, the superimposed collectors 6, 7 and the cell 11, are shown spaced quite far apart for purposes of illustration. In fact, however, it is preferred that these all be closely spaced to aid in channeling luminescent radiation leaving one to enter the next in series. Thus, if spaced far apart many of the shallow angle luminescent rays escaping the face of a given luminescent solar collector would not strike the element, be it a luminescent solar collector or a photocell. As a further measure to obviate this problem, in FIG. 5, there are shown mirrors 13, one on each side, to reflect back the shallow rays. Of course, again, the elements 6, 7 and 11 are all close together, so that the mirrors are actually much shorter than depicted. The use of such mirrors is of course also optional in the other embodiments of the invention.

In all of the embodiments of the invention, the precise shape and size of the lens or reflector is not the essence of the invention, and any suitable lens or reflector for optically concentrating the light onto the luminescent solar collector or collectors is suitable.

In the normal operation of the invention in any of the embodiments, the optical concentrating means is arranged in a known manner to track the sun, and the luminescent solar collectors can also be so arranged, or they can be left in an optimum attitude for a collector that does not track the sun. Of course, the tracking of the sun by the optical lens or mirror can be done in a coarse manner because it is not necessary exactly to outline the boundaries of the luminescent solar collector. When using very high concentration ratios with the optical lens or mirror, it may be desirable to screen out most of the wavelengths below 3500 Å and wavelengths above 9000 or 10,000 or 12,000 Å, depending on the inherent absorption for such wavelengths by the luminescent solar collector medium, simply in order to minimize the heating effects that could be caused by the absorption of such wave lengths. Such a screening can be effected in a known manner. For instance, one simple way is to construct the lens from poly(methyl methacrylate) which itself fairly well screens out such wave lengths. Another method is to interpose a filter material between the lens (or the reflector) and the luminescent solar collector that does absorb the offending wavelengths.

Furthermore, at very high overall concentration ratios, considerable heating of the photocell can be encountered, and such heating is counteracted by known photocell cooling means where desired.

Further, it should be mentioned that when a reflector is employed instead of a lens, the luminescent solar collector is also exposed to direct sunlight, although not concentrated. This is a difference between using a lens and a reflector, but the difference is of little consequence quantitatively. Another difference, of course, is that the luminescent solar collectors intercept a portion of the sun's rays before they can reach the reflector to be concentrated.

In the operation of the apparatus of FIGS. 1 and 2 lens 2 concentrates the sun's rays to impinge on most of the area of the row 4 of collectors 6. The luminescent species in 6 is excited by absorption of part of the rays and emits luminescence of longer wavelengths than the absorbed radiation. The portion of the luminescent radiation trapped by the process of total internal reflection finds its way to coupled photocell 8; note that rays reaching other of the three edges are reflected and eventually, except for minor reflection losses, reach cell 8. The unabsorbed solar radiation and the portion of the luminescent radiation not trapped is impinged on relatively large photocells 5 to generate further electricity.

The operation of FIG. 3 is the same except that the sunlight concentrated by reflector or mirror 10 impinges on the row of collectors 6 from below instead of from above.

In the operation of FIG. 5 lens 20 concentrates the sun's rays to impinge in a square pattern on most of the area of collector 6 and the trapped luminescent radiation finds its way to cell 8 as described relative to FIG. 1. The unabsorbed solar radiation and the portion of the luminescent radiation not trapped is impinged on luminescent solar collector 7 and the process repeats with further electricity being generated by photocell means 7. The residual solar radiation and the portion of the luminescent radiation not trapped in collector 7 passes from 7 directly to photovoltaic cell 11 to generate still further electrical energy.

In a specific example of the invention according to FIG. 5 a luminescent solar collector 6 comprises a poly(methyl methacrylate) plate 3 inches on a side and 3 mm. thick, containing 130 mgs. of fluorescent dye Coumarin 311 per 50 grams of polymer dispersed throughout, and one edge of the plate 6 is covered by a photovoltaic cadmuim telluride semiconductor cell having a P-N junction. To the other three edges there is applied a highly reflective aluminum coating. The cell has electrical connections (not shown) on opposite sides across the P-N junction. The cell is optically coupled and attached by a 20 weight percent poly(methyl methacrylate) in ethylene dichloride applied as an adhesive and serving as an index film. The solvent is of course allowed to dry, or evaporate.

Coumarin 311 is 7-dimethylamino-4-methylcoumarin.

The plate is made by dissolving Plexiglas poly(methyl methacrylate) and the requisite amount of the dye in ethylene dichloride to obtain a 35 weight percent solution of the acrylate. The mixture is cast in the shape of the plate of the foregoing dimensions and the solvent is allowed to evaporate slowly to form the plate, after which the solar cell is attached as noted. For collector 7 as in FIG. 5, a glass is made and cast in the form of a plate, which is ground and polished to the dimensions 3"×3"×3 mm. Three edges are aluminized and the other edge is covered with a gallium arsenide photocell, applied by painting a thin film of a polysiloxane solution on the face of the cell, applying the cell to the edge, and allowing the solvent to evaporate. The polysiloxane solution is 50 volume percent solution in butanol of partially cured but further curable resin prepared as described in Example 1 of U.S. Pat. No. 3,395,117 (incorporated herein by reference).

The glass for luminescent solar collector 7 is made of pure raw materials (sodium carbonate; silicic acid, sintered; calcium carbonate and europium oxide, $Eu_2O_3$) essentially entirely free of iron oxide. The glass has the following composition: T,0170

| Oxide | Mole Percent |
| --- | --- |
| $SiO_2$ | 70.8 |
| $Na_2O$ | 15.5 |
| CaO | 12.3 |
| $Eu_2O_3$ | 1.4 |

The europium of the luminescent solar collector has strong excitation absorption peaks at about 3900 Å and about 4650 Å as well as lesser peaks at lower and higher wavelengths, and has emission peaks at about 5900 and 6130 Å.

The cell 11 is a 3-inch square silicon semiconductor photovoltaic cell having a P-N junction, suitably supported for structural integrity.

In this example the size of the square Fresnel lens made of poly(methyl methacrylate) is 10 inches square, designed to impinge on a 2-inch square portion of the luminescent solar collector, so that the overall concentration ratio of rays reaching the cell is about 610X.

Any suitable luminescent species can be used in the method and apparatus of the invention and fluorescent dyes, luminescent metal chelates (both usually used in plastic), inorganic oxides such as $Eu_2O_3$ and $Sm_2O_3$ which are usually used as components of a glass luminescent solar collector, are examples of luminescent materials.

In additional to glass and poly(methyl methacrylate) luminescent solar collector host materials, there can be mentioned other materials useful as either the light conducting layer containing a luminescent species or as the light conducting layer containing no luminescent species but serving as part of the trapping medium for emitted luminescent radiation. These include, for instance, cured, solid silicone resins derived from trifunctional silanes such as those disclosed in U.S. Pat. Nos. 3,395,117, 3,388,114 and 3,389,121 for example; and other solid plastics and resins such as polycarbonates, polystyrene, ethylcellulose and nitrocellulose. Also, various glasses having good light conducting properties can be used including very expensive glasses of optical quality.

As will be evident to those skilled in the art, various modifications of this invention can be made or followed in the light of the foregoing disclosure and discussion without departing from the spirit and scope of the disclosure or from the scope of the claims.

I claim:
1. A process which comprises
   (1) concentrating solar radiation optically with lens or reflector means to provide optically concentrated radiation and
   (2) spectrally dividing said optically concentrated radiation by
      (i) absorbing a portion of said concentrated radiation and concentrating absorbed radiation in the form of longer wave length emitted luminescent radiation by the process of total internal reflection in a first luminescent solar collector,
      (ii) passing the residual portion of said optically concentrated radiation through said first luminescent solar collector, and repeating steps (i) and (ii) using one or more subsequent luminescent solar collectors in series acting on the residual optically concentrated radiation passing through the preceding luminescent solar collector,
   (3) passing the concentrated emitted luminescent radiation in said first collector to a first photovoltiac cell optically coupled to a relatively small surface area of said first luminescent solar collector and passing the concentrated emitted luminescent radiation in each said subsequent luminescent solar collector to a different photovoltaic cell having a different bandgap than said first cell, which different cell is optically coupled to a relatively small surface area of the subsequent luminescent solar collector.

2. A process of claim 1 wherein at least one of said luminescent solar collectors is optically coupled to a gallium arsenide photovoltaic cell.

* * * * *